(12) United States Patent
Khlat (10) Patent No.: US 12,224,725 B2
(45) Date of Patent: Feb. 11, 2025

(54) LOOKUP TABLE CALIBRATION APPARATUS AND METHOD

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 477 days.

(21) Appl. No.: 17/552,791

(22) Filed: Dec. 16, 2021

(65) Prior Publication Data

US 2022/0368300 A1   Nov. 17, 2022

Related U.S. Application Data

(60) Provisional application No. 63/188,023, filed on May 13, 2021, provisional application No. 63/188,034, filed on May 13, 2021.

(51) Int. Cl.
*H03G 3/30* (2006.01)
*H03F 3/24* (2006.01)
*H03H 11/16* (2006.01)

(52) U.S. Cl.
CPC ........... *H03G 3/3042* (2013.01); *H03F 3/245* (2013.01); *H03H 11/16* (2013.01); *H03F 2200/451* (2013.01); *H03G 2201/103* (2013.01); *H03G 2201/307* (2013.01)

(58) Field of Classification Search
CPC ........... H03G 3/3042; H03G 2201/103; H03G 2201/307; H03F 3/245; H03F 2200/451
See application file for complete search history.

(56) References Cited

U.S. PATENT DOCUMENTS

| | | | |
|---|---|---|---|
| 6,621,433 B1 * | 9/2003 | Hertz | G01R 33/3621 324/309 |
| 7,546,137 B2 * | 6/2009 | D'Hont | G06K 7/0008 370/282 |
| 7,977,919 B1 * | 7/2011 | Jaoude | H04B 1/06 320/136 |
| 9,577,771 B1 | 2/2017 | Lashkarian et al. | |

(Continued)

OTHER PUBLICATIONS

U.S. Appl. No. 17/564,734, filed Dec. 29, 2021.

(Continued)

*Primary Examiner* — Patricia T Nguyen
(74) *Attorney, Agent, or Firm* — Withrow & Terranova, P.L.L.C.

(57) ABSTRACT

A lookup table calibration apparatus and method are disclosed. The lookup table calibration apparatus includes a power amplifier circuit configured to amplify a radio frequency (RF) signal having time-variant power levels based on a modulated voltage. To ensure proper alignment between the modulated voltage and the time-variant power levels, the power amplifier circuit is further configured to phase-shift the RF signal based on a modulated phase correction voltage. Specifically, the modulated voltage is generated based on a modulated voltage lookup table and the modulated phase correction voltage is generated based on a phase correction voltage lookup table. Herein, the lookup table calibration apparatus can be configured to concurrently populate and/or calibrate the modulated voltage lookup table and the phase correction voltage lookup table based on a measured gain and a measured phase of the RF signal, respectively.

12 Claims, 4 Drawing Sheets

(56) References Cited

U.S. PATENT DOCUMENTS

| | | | |
|---|---|---|---|
| 9,755,579 B1 | 9/2017 | Ahmed et al. | |
| 11,165,515 B2 | 11/2021 | Tiebout et al. | |
| 2007/0189417 A1* | 8/2007 | Waheed | H04L 7/005 375/300 |
| 2012/0140852 A1* | 6/2012 | Kato | H03F 3/189 375/298 |
| 2016/0164551 A1* | 6/2016 | Khlat | H03F 3/19 330/297 |
| 2016/0249300 A1* | 8/2016 | Tsai | H04B 17/13 |
| 2022/0069774 A1* | 3/2022 | Emira | H03B 5/04 |
| 2022/0368283 A1 | 11/2022 | Folkmann et al. | |
| 2022/0368293 A1 | 11/2022 | Khlat | |
| 2022/0368294 A1 | 11/2022 | Khlat | |
| 2022/0368295 A1 | 11/2022 | Khlat | |
| 2023/0080652 A1* | 3/2023 | Khlat | H04B 1/76 455/552.1 |

OTHER PUBLICATIONS

U.S. Appl. No. 17/536,189, filed Nov. 29, 2021.
U.S. Appl. No. 17/564,852, filed Dec. 29, 2021.
U.S. Appl. No. 17/536,234, filed Nov. 29, 2021.
Non-Final Office Action for U.S. Appl. No. 17/564,734, mailed Jul. 17, 2024, 9 pages.
Final Office Action for U.S. Appl. No. 17/564,734, mailed Sep. 25, 2024, 10 pages.
Non-Final Office Action for U.S. Appl. No. 17/536,189, mailed Oct. 1, 2024, 12 pages.
Non-Final Office Action for U.S. Appl. No. 17/564,852, mailed Oct. 1, 2024, 9 pages.
Non-Final Office Action for U.S. Appl. No. 17/536,234, mailed Oct. 16, 2024, 17 pages.

* cited by examiner

*FIG. 1*
*(RELATED ART)*

| POWER INDEX | MODULATED VOLTAGE TARGET |
|---|---|
| $P_{IDX}$-1 | $V_{CC}$-TGT-1 |
| ... | ... |
| $P_{IDX}$-N | $V_{CC}$-TGT-N |

LUT-$V_{CC}$

*FIG. 2A*
*(RELATED ART)*

| POWER INDEX | PHASE CORRECTION VOLTAGE TARGET |
|---|---|
| $P_{IDX}$-1 | $V_{PHASE}$-TGT-1 |
| ... | ... |
| $P_{IDX}$-N | $V_{PHASE}$-TGT-N |

LUT-$V_{PHASE}$

LOOKUP TABLE CALIBRATION APPARATUS AND METHOD

RELATED APPLICATIONS

This application claims the benefit of provisional patent application Ser. No. 63/188,034, filed May 13, 2021, and provisional patent application Ser. No. 63/188,023, filed May 13, 2021, the disclosures of which are hereby incorporated herein by reference in their entireties.

FIELD OF THE DISCLOSURE

The technology of the disclosure relates generally to an apparatus and a method for performing lookup table (LUT) calibration.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) is a power management technique designed to improve operating efficiency of the power amplifier(s). Specifically, the power amplifier(s) is configured to amplify the RF signal(s) based on a time-variant ET voltage that closely tracks a time-variant power envelope of the RF signal(s). The time-variant voltage is typically generated by an ET integrated circuit (ETIC) in the wireless communication device. Notably, the inherent processing delay associated with the ETIC can inadvertently cause the time-variant ET voltage to misalign in time and/or phase with the time-variant power envelope of the RF signal(s). As a result, the peaks of the time-variant ET voltage may become misaligned with the peaks of the time-variant power envelope, which may cause the power amplifier(s) to clip and distort the RF signal(s). In this regard, it is desirable to ensure that the ETIC can maintain good time and phase alignment between the time-variant ET voltage and the time-variant power envelope of the RF signal(s).

SUMMARY

Aspects disclosed in the detailed description include a lookup table calibration apparatus and method. The lookup table calibration apparatus includes a power amplifier circuit configured to amplify a radio frequency (RF) signal having time-variant power levels based on a modulated voltage. To ensure proper alignment between the modulated voltage and the time-variant power levels, the power amplifier circuit is further configured to phase-shift the RF signal based on a modulated phase correction voltage. Specifically, the modulated voltage is generated based on a modulated voltage lookup table and the modulated phase correction voltage is generated based on a phase correction voltage lookup table. Herein, the lookup table calibration apparatus can be configured to concurrently populate and/or calibrate the modulated voltage lookup table and the phase correction voltage lookup table based on a measured gain and a measured phase of the RF signal, respectively.

In one aspect, a lookup table calibration apparatus is provided. The lookup table calibration apparatus includes a power amplifier circuit. The power amplifier circuit includes a phase shifter circuit. The phase shifter circuit is configured to phase-shift an RF signal based on a modulated phase correction voltage generated based on a phase correction voltage lookup table. The phase correction voltage lookup table includes multiple power indexes each correlating a respective power level of the RF signal with a respective one of multiple phase correction voltage targets. The power amplifier circuit also includes a power amplifier. The power amplifier is configured to amplify the phase-shifted RF signal based on a modulated voltage generated based on a modulated voltage lookup table. The modulated voltage lookup table includes the multiple power indexes each correlating the respective power level of the RF signal with a respective one of multiple modulated voltage targets. The lookup table calibration apparatus also includes a calibration control circuit. The calibration control circuit is configured to, for each of the multiple power indexes, adjust the modulated voltage until a measured gain of the amplified RF signal equals a reference gain. The calibration control circuit is also configured to, for each of the multiple power indexes, update the respective one of the multiple modulated voltage targets in the modulated voltage lookup table based on the adjusted modulated voltage. The calibration control circuit is also configured to, for each of the multiple power indexes, adjust the modulated phase correction voltage until a measured phase of the amplified RF signal equals a reference phase. The calibration control circuit is also configured to, for each of the multiple power indexes, update the respective one of the multiple phase correction voltage targets in the phase correction voltage lookup table based on the adjusted modulated phase correction voltage.

In another aspect, a method for performing a lookup table calibration is provided. The method includes receiving a measured gain and a measured phase of an RF signal for each of multiple power indexes. The method also includes adjusting a modulated voltage until the measured gain equals a reference gain. The method also includes updating a respective one of multiple modulated voltage targets in a modulated voltage lookup table based on the adjusted modulated voltage. The method also includes adjusting a modulated phase correction voltage until the measured phase equals a reference phase. The method also includes updating a respective one of multiple phase correction voltage targets in a phase correction voltage lookup table based on the adjusted modulated phase correction voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a lookup table calibration apparatus and method. The lookup table calibration apparatus includes a power amplifier circuit configured to amplify a radio frequency (RF) signal having time-variant power levels based on a modulated voltage. To ensure proper alignment between the modulated voltage and the time-variant power levels, the power amplifier circuit is further configured to phase-shift the RF signal based on a modulated phase correction voltage. Specifically, the modulated voltage is generated based on a modulated voltage lookup table and the modulated phase correction voltage is generated based on a phase correction voltage lookup table. Herein, the lookup table calibration apparatus can be configured to concurrently populate and/or calibrate the modulated voltage lookup table and the phase correction voltage lookup table based on a measured gain and a measured phase of the RF signal, respectively.

Figure 1:
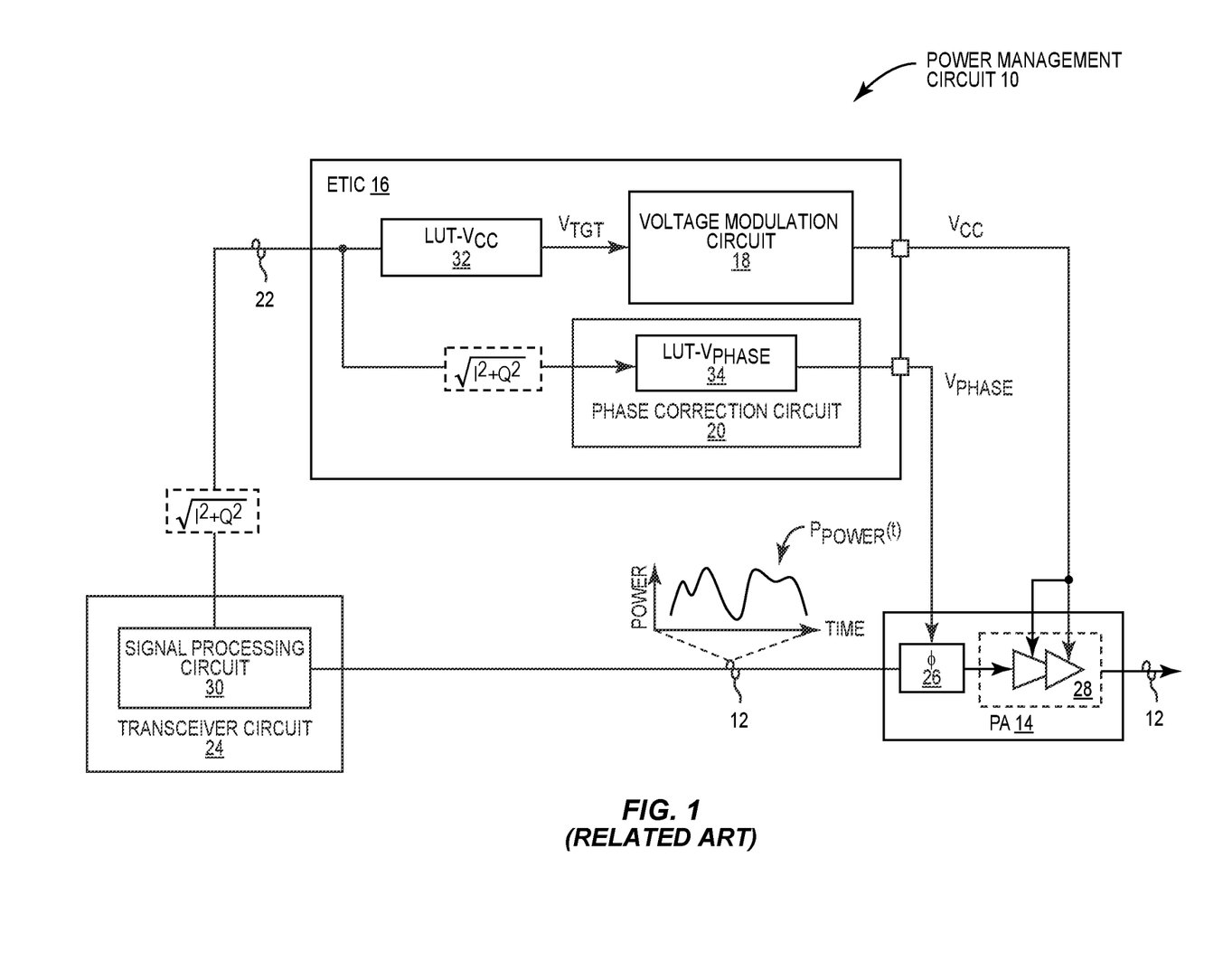
FIG. 1 is a schematic diagram of an exemplary power amplifier circuit that can support phase correction in a radio frequency (RF) signal.
Figure 2A:
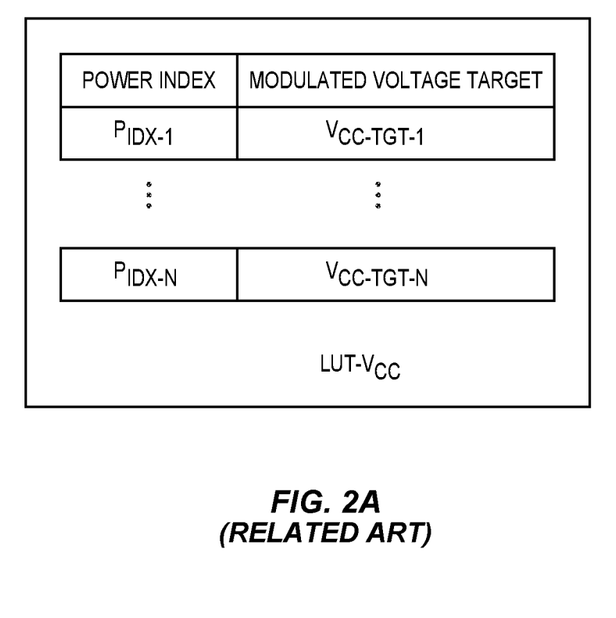
FIGS. 2A and 2B provide exemplary illustrations of a pair of lookup tables employed by the power amplifier circuit of FIG. 1 to enable phase correction on the RF signal.
Figure 2B:
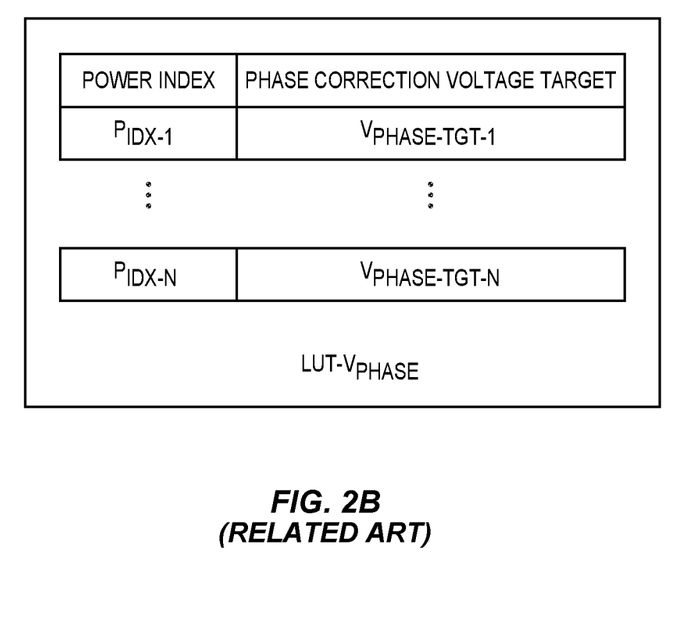
Figure 3:
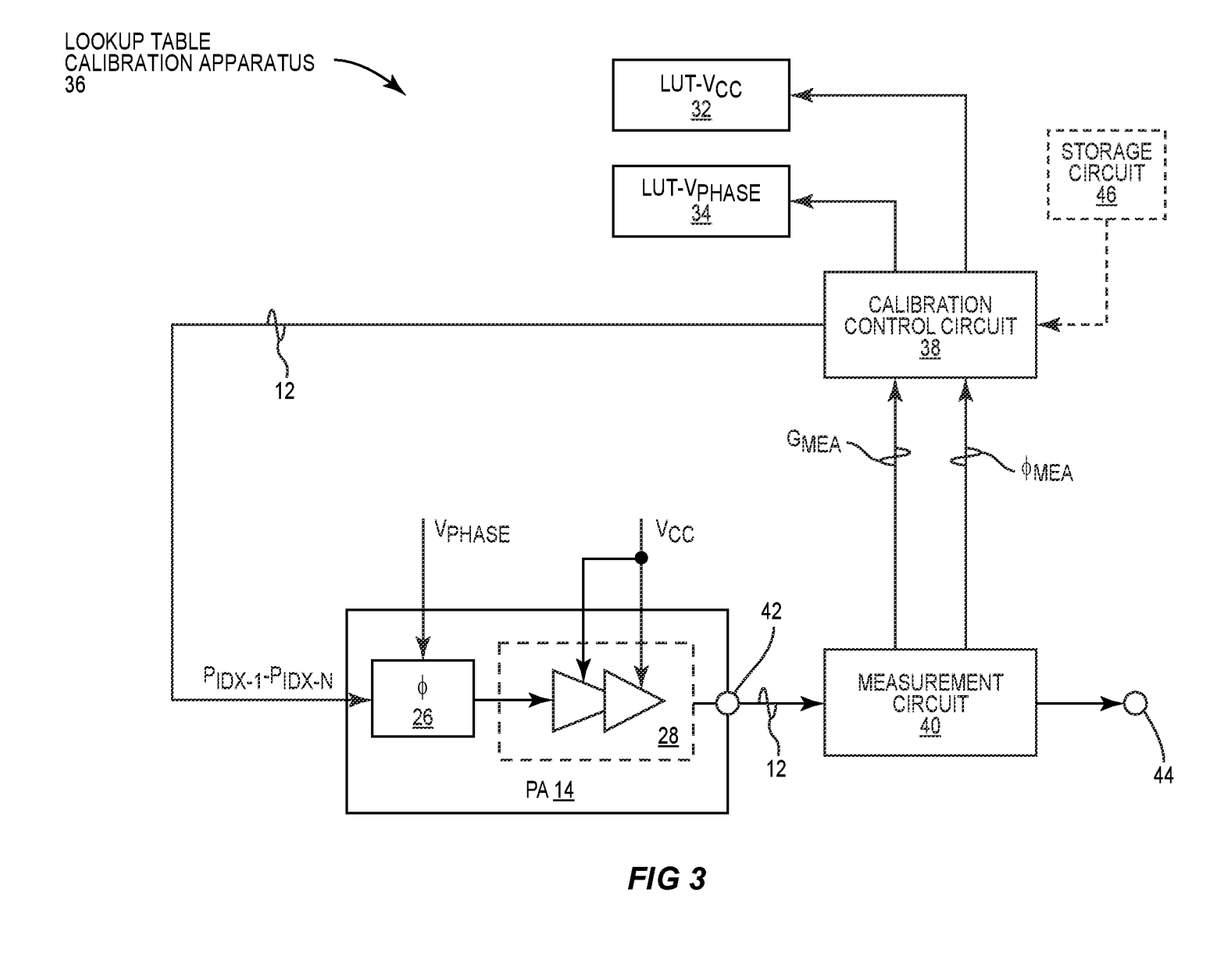
FIG. 3 is a schematic diagram of an exemplary lookup table calibration apparatus configured according to an embodiment of the present disclosure to calibrate the pair of lookup tables in FIGS. 2A and 2B.

Before discussing the lookup table calibration apparatus and method of the present disclosure, starting at FIG. 3, a brief overview of a power amplifier circuit, for which lookup table calibration may be performed, is first provided with reference to FIGS. 1, 2A, and 2B.

FIG. 1 is a schematic diagram of an exemplary power management circuit 10 that can support phase correction in an RF signal 12. The power management circuit 10 includes a power amplifier circuit 14 and an ETIC 16. The power amplifier circuit 14 is configured to amplify the RF signal 12 based on a modulated voltage $V_{CC}$ that tracks a time-variant power envelope $P_{POWER}(t)$ of the RF signal 12. The ETIC 16 is configured to generate the modulated voltage $V_{CC}$ and a modulated phase correction voltage $V_{PHASE}$ to thereby cause a phase change in the RF signal 12.

The ETIC 16 includes a voltage modulation circuit 18 configured to generate the modulated voltage $V_{CC}$ and a phase correction circuit 20 configured to generate the modulated phase correction voltage $V_{PHASE}$. The ETIC 16 receives an envelope indication signal 22 that indicates the time-variant power envelope $P_{POWER}(t)$. In this regard, the voltage modulation circuit 18 and the phase correction circuit 20 can be configured to generate the modulated voltage $V_{CC}$ and the modulated phase correction voltage $V_{PHASE}$, respectively, based on the envelope indication signal 22.

The power management circuit 10 is coupled to a transceiver circuit 24. The transceiver circuit 24 can be configured to generate and provide the RF signal 12 to the power amplifier circuit 14. In addition, the transceiver circuit 24 is also configured to generate and provide the envelope indication signal 22 to the ETIC 16. Given that the transceiver circuit 24 generates the RF signal 12 associated with the time-variant power envelope $P_{POWER}(t)$, the transceiver circuit 24 is able to provide an indication of the time-variant power envelope $P_{POWER}(t)$ via the envelope indication signal 22.

The power amplifier circuit 14 includes a phase shifter circuit 26 and a power amplifier 28. The phase shifter circuit 26 is coupled to the phase correction circuit 20 to receive the modulated phase correction voltage $V_{PHASE}$. The phase shifter circuit 26 may include internal storage (not shown), such as registers for example, to correlate various levels of the modulated phase correction voltage $V_{PHASE}$ with various degrees of phase shift. For example, the modulated phase correction voltage $V_{PHASE}$ of 0 V, 1 V, and 2 V can correspond to 0°, 1°, and 2° phase shift, respectively. In this regard, the phase shifter circuit 26 can determine a proper phase shift based on the modulated phase correction voltage $V_{PHASE}$ and, accordingly, phase-shift the RF signal 12 based on the determined phase shift. The phase-shifted RF signal 12 is subsequently amplified by the power amplifier 28.

The transceiver circuit 24 includes a signal processing circuit 30. The signal processing circuit 30 is configured to generate the RF signal 12 and, accordingly, the time-variant power envelope $P_{POWER}(t)$. In a non-limiting example, the signal processing circuit 30 can include a digital baseband circuit (not shown) that generates a digital version of the RF signal 12 and a digital-to-analog converter (not shown) to convert the digital version of the RF signal 12 into the RF signal 12. The digital version of the RF signal 12 can include an in-phase (I) component and a quadrature (Q) component. Accordingly, the signal processing circuit 30 can sample the time-variant power envelope $P_{POWER}(t)$ to determine a time-variant amplitude (expressed as $\sqrt{I^2+Q^2}$) of the time-variant power envelope $P_{POWER}(t)$.

The ETIC 16 includes a target voltage circuit 32. The target voltage circuit 32 includes a modulated voltage lookup table LUT-$V_{CC}$ that correlates a time-variant power level, as represented by the time-variant amplitude ($\sqrt{I^2+Q^2}$), of the time-variant power envelope $P_{POWER}(t)$ with a time-variant target voltage VTGT. The voltage modulation circuit 18 is coupled to the target voltage circuit 32 and configured to generate the modulated voltage $V_{CC}$ to track the time-variant target voltage VTGT.

The phase correction circuit 20 include a phase correction voltage circuit 34. The phase correction voltage circuit 34 includes a phase correction voltage lookup table LUT-$V_{PHASE}$ that correlates the time-variant power level, as represented by the time-variant amplitude ($\sqrt{I^2+Q^2}$), of the time-variant power envelope $P_{POWER}(t)$ with the modulated phase correction voltage $V_{PHASE}$. Accordingly, the phase correction circuit 20 can generate the modulated phase correction voltage $V_{PHASE}$ based on the time-variant power level of the time-variant power envelope $P_{POWER}(t)$.

For a more detailed description as to how the power management circuit 10 performs the phase correction in the RF signal 12, please refer to U.S. patent application Ser. No. 17/536,189, entitled "POWER MANAGEMENT CIRCUIT SUPPORTING PHASE CORRECTION IN AN ANALOG SIGNAL."

FIG. 2A provides an example of the modulated voltage lookup table LUT-$V_{CC}$ in the power management circuit 10 of FIG. 1. The modulated voltage lookup table LUT-$V_{CC}$ includes multiple power indexes $P_{IDX-1}$-$P_{IDX-N}$, each corresponding to a respective time-variant amplitude ($\sqrt{I^2+Q^2}$) of the time-variant power envelope $P_{POWER}(t)$. The modulated voltage lookup table LUT-$V_{CC}$ also includes multiple modulated voltage targets $V_{CC-TGT-1}$-$V_{CC-TGT-N}$, each corresponding to a respective one of the power indexes $P_{IDX-1}$-$P_{IDX-N}$. In this regard, to generate the time-variant target voltage VTGT, the target voltage circuit 32 can first determine a respective one of the power indexes $P_{IDX-1}$-$P_{IDX-N}$ based on the time-variant amplitude ($\sqrt{I^2+Q^2}$) of the time-variant power envelope $P_{POWER}(t)$ and then select a respective one of the modulated voltage targets $V_{CC-TGT-1}$-$V_{CC-TGT-N}$ in the modulated voltage lookup table LUT-$V_{CC}$ based on the respective one of the power indexes $P_{IDX-1}$-$P_{IDX-N}$.

FIG. 2B provides an example of the phase correction voltage lookup table LUT-$V_{PHASE}$ in the power management circuit 10 of FIG. 1. The phase correction voltage lookup table LUT-$V_{PHASE}$ includes the power indexes $P_{IDX-1}$-$P_{IDX-N}$, each corresponding to a respective time-variant amplitude ($\sqrt{I^2+Q^2}$) of the time-variant power envelope $P_{POWER}(t)$. The phase correction voltage lookup table LUT-$V_{PHASE}$ also includes multiple phase correction voltage targets $V_{PHASE-TGT-1}$-$V_{PHASE-TGT-N}$, each corresponding to a respective one of the power indexes $P_{IDX-1}$-$P_{IDX-N}$. In this regard, to generate the modulated phase correction voltage $V_{PHASE}$, the phase correction voltage circuit 34 can first determine a respective one of the power indexes $P_{IDX-1}$-$P_{IDX-N}$ based on the time-variant amplitude ($\sqrt{I^2+Q^2}$) of the time-variant power envelope $P_{POWER}(t)$ and then select a respective one of the phase correction voltage targets $V_{PHASE-TGT-1}$-$V_{PHASE-TGT-N}$ in the phase correction voltage lookup table LUT-$V_{PHASE}$ based on the respective one of the power indexes $P_{IDX-1}$-$P_{IDX-N}$.

Herein, the modulated voltage lookup table LUT-$V_{CC}$ and the phase correction voltage lookup table LUT-$V_{PHASE}$ are both populated based on the power indexes $P_{IDX-1}$-$P_{IDX-N}$. However, it should be appreciated that it is also possible to populate the modulated voltage lookup table LUT-$V_{CC}$ and the phase correction voltage lookup table LUT-$V_{PHASE}$ based on different power indexes. For example, the modulated voltage lookup table LUT-$V_{CC}$ can be populated with more power indexes than the phase correction voltage lookup table LUT-$V_{PHASE}$ in case a higher granularity is required for the time-variant target voltage VTGT.

The modulated voltage lookup table LUT-$V_{CC}$ and the phase correction voltage lookup table LUT-$V_{PHASE}$ may each be pre-populated in the ETIC 16 (e.g., during fabrication and/or factory test) with a respective set of predetermined parameters. However, when the ETIC 16 is actually coupled with the power amplifier circuit 14 and the transceiver circuit 24 in the power management circuit 10, the predetermined parameters pre-populated in the modulated voltage lookup table LUT-$V_{CC}$ and/or the phase correction voltage lookup table LUT-$V_{PHASE}$ may have to be adjusted for an optimal performance. As such, there is a need to calibrate the modulated voltage lookup table LUT-$V_{CC}$ and/or the phase correction voltage lookup table LUT-$V_{PHASE}$ in the power management circuit 10.

In this regard, FIG. 3 is a schematic diagram of an exemplary lookup table calibration apparatus 36 configured according to an embodiment of the present disclosure to calibrate the modulated voltage lookup table LUT-$V_{CC}$ of FIG. 2A and the phase correction voltage lookup table LUT-$V_{PHASE}$ of FIG. 2B. Common elements between FIGS. 1 and 3 are shown therein with common element numbers and will not be re-described herein.

In an embodiment, the lookup table calibration apparatus 36 includes a calibration control circuit 38, which can be a field-programmable gate array (FPGA) or a dedicated calibration equipment, as an example. The lookup table calibration apparatus 36 also includes a measurement circuit 40, which may be provided between an output 42 of the power amplifier circuit 14 and an antenna port 44, to provide a measured gain $G_{MEA}$ and a measured phase $\phi_{MEA}$ of the RF signal 12 to the calibration control circuit 38. The lookup table calibration apparatus 36 may also include a storage circuit 46 (e.g., a flash storage, a register bank, etc.) to store parameters required for the lookup table calibration.

The power management circuit 10 may be placed in a calibration mode during the lookup table calibration. For example, the transceiver circuit 24 can be temporally deactivated and the calibration control circuit 38 can be configured to generate the RF signal 12 for the power amplifier circuit 14. More specifically, the calibration control circuit 38 is configured to generate the RF signal 12 at a respective power level (e.g., $\sqrt{I^2+Q^2}$) corresponding to each of the power indexes $P_{IDX-1}$-$P_{IDX-N}$.

Figure 4:
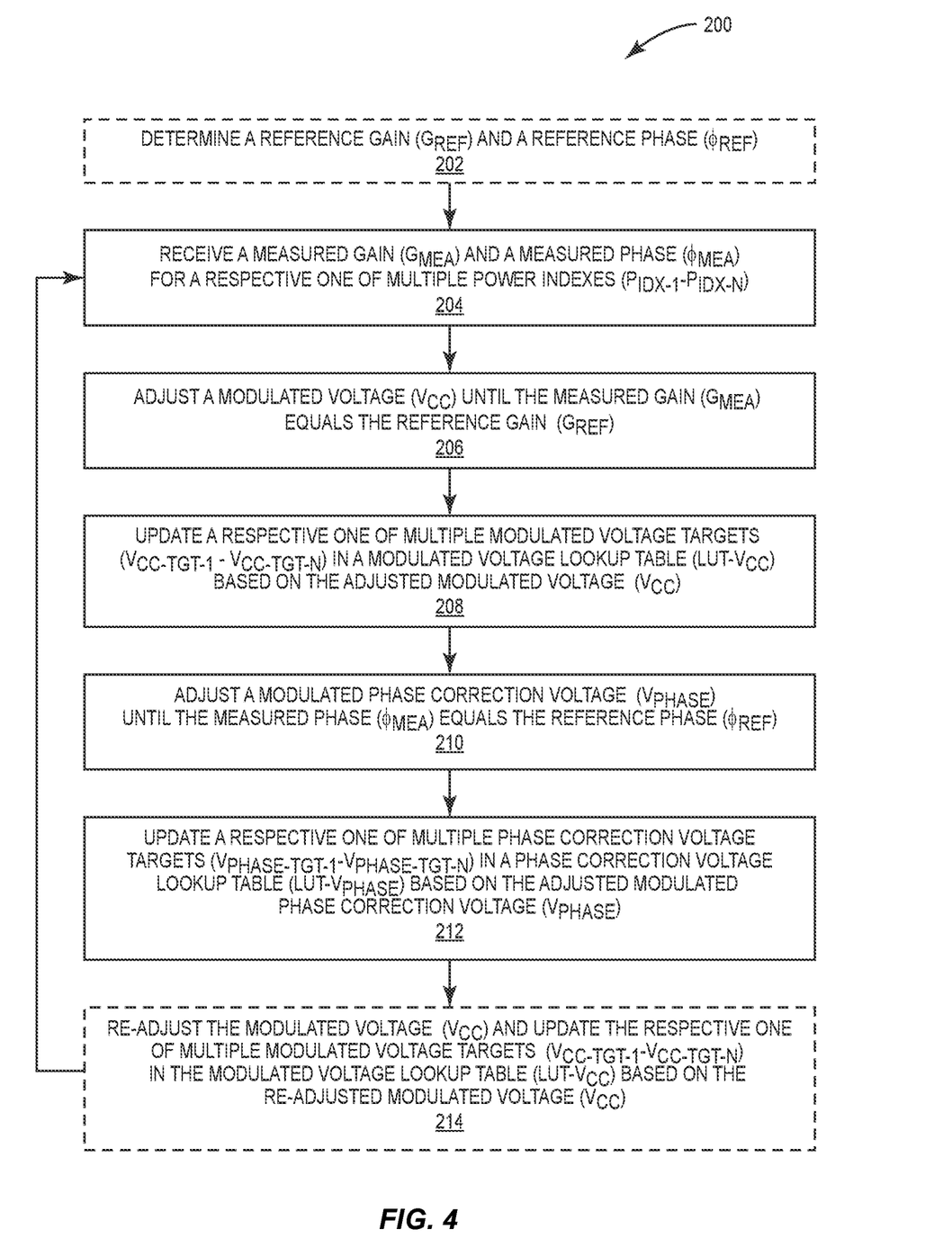
FIG. 4 is a flowchart of an exemplary process that may be employed by the lookup table calibration apparatus of FIG. 3 for performing lookup table calibration.

In an embodiment, the lookup table calibration apparatus 36 can be configured to calibrate concurrently the modulated voltage lookup table LUT-$V_{CC}$ and the phase correction voltage lookup table LUT-$V_{PHASE}$ during a process, as further described in FIG. 4. FIG. 4 is a flowchart of an exemplary process 200 that may be employed by the lookup table calibration apparatus 36 of FIG. 3 for performing the lookup table calibration.

The calibration control circuit 38 may be configured to determine a reference gain $G_{REF}$ and a reference phase $\phi_{REF}$ (step 202). In one embodiment, the calibration control circuit 38 may determine and store the reference gain $G_{REF}$ and the reference phase $\phi_{REF}$ in the storage circuit 46. In another embodiment, the reference gain $G_{REF}$ and the reference phase $\phi_{REF}$ may have been prestored in the storage circuit 46. As such, the calibration control circuit 38 may retrieve the reference gain $G_{REF}$ and the reference phase $\phi_{REF}$ from the storage circuit 46.

The calibration control circuit 38 is configured to calibrate the modulated voltage lookup table LUT-$V_{CC}$ and the phase correction voltage lookup table LUT-$V_{PHASE}$ by repeating the following steps (steps 204 to 214) for each of the power indexes $P_{IDX-1}$-$P_{IDX-N}$. As mentioned earlier, for each of the power indexes $P_{IDX-1}$-$P_{IDX-N}$, the calibration control circuit 38 is configured to generate the RF signal 12 at the respective power level and provide the RF signal to the power amplifier circuit 14.

Specifically, the calibration control circuit 38 receives the measured gain $G_{MEA}$ and the measured phase $\phi_{MEA}$ from the measurement circuit 40 for a respective one of the power indexes $P_{IDX-1}$-$P_{IDX-N}$ (step 204). Accordingly, the calibration control circuit 38 adjusts the modulated voltage $V_{CC}$ (e.g., by controlling the ETIC 16) until the measured gain $G_{MEA}$ equals the reference gain $G_{REF}$ (step 206). The calibration control circuit 38 then updates a respective one of the modulated voltage targets $V_{CC-TGT-1}$-$V_{CC-TGT-N}$ in the modulated voltage lookup table LUT-$V_{CC}$, which corresponds to the respective one of the power indexes $P_{IDX-1}$-$P_{IDX-N}$, based on the adjusted modulated voltage $V_{CC}$ (step 208).

The calibration control circuit 38 is further configured to adjust the modulated phase correction voltage $V_{PHASE}$ (e.g., by controlling the ETIC 16) until the measured phase (MEA equals the reference phase (REF (step 210). Accordingly, the calibration control circuit 38 updates a respective one of the phase correction voltage targets $V_{PHASE-TGT-1}$-$V_{PHASE-TGT-N}$ in the phase correction voltage lookup table LUT-$V_{PHASE}$, which corresponds to the respective one of the power indexes $P_{IDX-1}$-$P_{IDX-N}$, based on the adjusted modulated phase correction voltage $V_{PHASE}$ (step 212).

To ensure that the adjusted modulated phase correction voltage $V_{PHASE}$ does not cause any amplitude change in the adjusted modulated voltage $V_{CC}$ (as determined in step 206), the calibration control circuit may perform an optional step to re-calibrate the adjusted modulated voltage $V_{CC}$. Specifically, the calibration control circuit 38 may re-adjust the modulated voltage $V_{CC}$ until the measured gain $G_{MEA}$ once again equals the reference gain $G_{REF}$ and then update the respective one of the modulated voltage targets $V_{CC-TGT-1}$-$V_{CC-TGT-N}$ in the modulated voltage lookup table LUT-$V_{CC}$ based on the re-adjusted modulated voltage $V_{CC}$ (step 214).

Those skilled in the art will recognize improvements and modifications to the preferred embodiments of the present disclosure. All such improvements and modifications are considered within the scope of the concepts disclosed herein and the claims that follow.

What is claimed is:

1. A lookup table calibration apparatus comprising:
   a power amplifier circuit comprising:
      a phase shifter circuit configured to phase-shift a radio frequency (RF) signal based on a modulated phase correction voltage generated based on a phase correction voltage lookup table comprising a plurality of power indexes each correlating a respective power level of the RF signal with a respective one of a plurality of phase correction voltage targets; and
      a power amplifier configured to amplify the phase-shifted RF signal based on a modulated voltage generated based on a modulated voltage lookup table comprising the plurality of power indexes each correlating the respective power level of the RF signal with a respective one of a plurality of modulated voltage targets; and
   a calibration control circuit configured to, for each of the plurality of power indexes:
      adjust the modulated voltage until a measured gain of the amplified RF signal equals a reference gain;
      update the respective one of the plurality of modulated voltage targets in the modulated voltage lookup table based on the adjusted modulated voltage;
      adjust the modulated phase correction voltage until a measured phase of the amplified RF signal equals a reference phase; and
      update the respective one of the plurality of phase correction voltage targets in the phase correction voltage lookup table based on the adjusted modulated phase correction voltage.

2. The lookup table calibration apparatus of claim 1, wherein, for each of the plurality of power indexes, the calibration control circuit is further configured to generate the RF signal at the respective power level and provide the RF signal to the power amplifier circuit.

3. The lookup table calibration apparatus of claim 1, further comprising a measurement circuit coupled to an output of the power amplifier circuit and configured to generate the measured gain and the measured phase of the amplified RF signal.

4. The lookup table calibration apparatus of claim 1, further comprising a storage circuit configured to store the reference gain and the reference phase.

5. The lookup table calibration apparatus of claim 4, wherein the calibration control circuit is further configured to:
   determine the reference gain and the reference phase of the RF signal; and
   store the reference gain and the reference phase in the storage circuit.

6. The lookup table calibration apparatus of claim 1, wherein the calibration control circuit is further configured to:
   determine whether the measured gain is equal to the reference gain after adjusting the modulated phase correction voltage to cause the measured phase to equal the reference phase; and
   in response to determining that the measured gain is different from the reference gain:
      re-adjust the modulated voltage until the measured gain of the amplified RF signal equals the reference gain; and
      update the respective one of the plurality of modulated voltage targets in the modulated voltage lookup table based on the re-adjusted modulated voltage.

7. The lookup table calibration apparatus of claim 1, wherein the modulated voltage lookup table and the phase correction voltage lookup table are both provided in an envelope tracking integrated circuit (ETIC) configured to generate the modulated voltage and the modulated phase correction voltage.

8. A method for performing lookup table calibration comprising:
   receiving a measured gain and a measured phase of a radio frequency (RF) signal for each of a plurality of power indexes;
   adjusting a modulated voltage until the measured gain equals a reference gain;
   updating a respective one of a plurality of modulated voltage targets in a modulated voltage lookup table based on the adjusted modulated voltage;
   adjusting a modulated phase correction voltage until the measured phase equals a reference phase; and
   updating a respective one of a plurality of phase correction voltage targets in a phase correction voltage lookup table based on the adjusted modulated phase correction voltage.

9. The method of claim 8, further comprising, for each of the plurality of power indexes, generating the RF signal at the respective power level.

10. The method of claim 8, further comprising measuring the RF signal at an output of a power amplifier circuit to generate the measured gain and the measured phase.

11. The method of claim 8, further comprising:
   determining the reference gain and the reference phase of the RF signal; and
   storing the determined reference gain and the determined reference phase in a storage circuit.

12. The method of claim 8, further comprising:
   determining whether the measured gain is equal to the reference gain after adjusting the modulated phase correction voltage to cause the measured phase to equal the reference phase; and
   in response to determining that the measured gain is different from the reference gain:
      re-adjusting the modulated voltage until the measured gain of the amplified RF signal equals the reference gain; and
      updating the respective one of the plurality of modulated voltage targets in the modulated voltage lookup table based on the re-adjusted modulated voltage.

* * * * *

UNITED STATES PATENT AND TRADEMARK OFFICE
CERTIFICATE OF CORRECTION

PATENT NO. : 12,224,725 B2
APPLICATION NO. : 17/552791
DATED : February 11, 2025
INVENTOR(S) : Nadim Khlat It is certified that error appears in the above-identified patent and that said Letters Patent is hereby corrected as shown below:

In the Specification

In Column 8, Line 10, replace "phase (MEA" with --phase $\phi_{MEA}$--.

In Column 8, Line 11, replace "phase (REF" with --phase $\phi_{REF}$--.

Signed and Sealed this
Eighteenth Day of March, 2025

Coke Morgan Stewart
*Acting Director of the United States Patent and Trademark Office*